United States Patent
Zheleva et al.

(10) Patent No.: US 8,637,901 B2
(45) Date of Patent: Jan. 28, 2014

(54) LOW-DEFECT DENSITY GALLIUM NITRIDE SEMICONDUCTOR STRUCTURES AND DEVICES THEREOF

(75) Inventors: Tsvetanka Zheleva, Rockville, MD (US); Shah Pankaj, Rockville, MD (US); Michael Derenge, Columbia, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 13/568,362

(22) Filed: Aug. 7, 2012

(65) Prior Publication Data

US 2013/0207119 A1    Aug. 15, 2013

Related U.S. Application Data

(60) Division of application No. 12/459,115, filed on Jun. 19, 2009, now Pat. No. 8,314,016, and a continuation-in-part of application No. 11/253,609, filed on Oct. 20, 2005, now abandoned.

(60) Provisional application No. 61/129,332, filed on Jun. 19, 2008.

(51) Int. Cl.
*H01L 31/102* (2006.01)

(52) U.S. Cl.
USPC .................. 257/189; 257/183; 257/E33.023; 257/E33.03

(58) Field of Classification Search
USPC ....... 257/79, 183, 184, 189, E33.023, E33.03
See application file for complete search history.

(56) References Cited

U.S. PATENT DOCUMENTS

| | | | | |
|---|---|---|---|---|
| 6,265,289 | B1* | 7/2001 | Zheleva et al. | 438/503 |
| 2006/0270076 | A1* | 11/2006 | Imer et al. | 438/22 |
| 2008/0128862 | A1* | 6/2008 | Sugimoto et al. | 257/615 |

* cited by examiner

*Primary Examiner* — Julia Slutsker
(74) *Attorney, Agent, or Firm* — Robert Thompson

(57) ABSTRACT

A low-defect gallium nitride structure including a first gallium nitride layer comprising a plurality of gallium nitride columns etched into the first gallium nitride layer and a first dislocation density; and a second gallium nitride layer that extends over the gallium nitride columns and comprises a second dislocation density, wherein the second dislocation density may be lower than the first dislocation density. In addition, a method for fabricating a gallium nitride semiconductor layer that includes masking an underlying gallium nitride layer with a mask that comprises an array of columns and growing the underlying gallium nitride layer through the columns and onto said mask using metal-organic chemical vapor deposition pendeo-epitaxy to thereby form a pendeo-epitaxial gallium nitride layer coalesced on said mask to form a continuous pendeo-epitaxial monocrystalline gallium nitride semiconductor layer.

10 Claims, 4 Drawing Sheets

LOW-DEFECT DENSITY GALLIUM NITRIDE SEMICONDUCTOR STRUCTURES AND DEVICES THEREOF

CROSS REFERENCE TO RELATED APPLICATIONS

This application is a divisional of co-pending application Ser. No. 12/459,115, filed in the name of Tsvetanka Spassova Zheleva on Jun. 19, 2009. This application claims the benefit of U.S. Provisional Patent Application No. 61/129,332 filed on Jun. 19, 2008, the complete disclosures of which, in their entirety, are herein incorporated by reference. This application is also a continuation-in-part of U.S. patent application Ser. No. 11/253,609 filed on Oct. 20, 2005, the complete disclosure of which, in its entirety, is also herein incorporated by reference.

GOVERNMENT INTEREST

The embodiments described herein may be manufactured, used, and/or licensed by or for the United States Government without the payment of royalties thereon.

BACKGROUND

1. Technical Field

The embodiments herein generally relate to microelectronic devices and fabrication methods and, more particularly, to gallium nitride semiconductor devices and fabrication methods thereof.

2. Description of the Related Art

Gallium nitride is being widely investigated for microelectronic devices including but not limited to transistors, field emitters, and optoelectronic devices. It will be understood that, as used herein, gallium nitride also includes alloys of gallium nitride such as aluminum gallium nitride, indium gallium nitride and aluminum indium gallium nitride.

A major problem in fabricating gallium nitride-based microelectronic devices is the fabrication of gallium nitride semiconductor layers having low defect densities. It is known that contributors to defect density are the lattice and thermal mismatch between the substrate and the gallium nitride layer. Accordingly, although gallium nitride layers have been grown on sapphire substrates, it is possible to reduce defect density by growing gallium nitride layers on aluminum nitride buffer layers which are themselves formed on silicon carbide substrates.

SUMMARY

In view of the foregoing, an embodiment herein provides a gallium nitride semiconductor device comprising: a first gallium nitride layer comprising a plurality of gallium nitride columns etched into the first gallium nitride layer and a first dislocation density; and a second gallium nitride layer that extends adjacent to the sidewalls and over the gallium nitride columns and comprises a second layer of regions with low and high dislocation density.

The first gallium nitride layer may be vertically aligned over the second gallium nitride layer. Furthermore, each of the plurality of gallium nitride columns may be of width between about 1 µm and about 100 µm wide. In addition, each of the plurality of gallium nitride columns may be separated by a distance in the range of about 1 µm to about 100 µm, but is not necessarily limited to this range. Additionally, the second gallium nitride layer may be grown using a lateral epitaxial overgrowth. In addition, the on the second gallium nitride layer a Schottky contact may be fabricated comprising, but not limited to 500 Å of Ni and approximately 1,500 Å of Au.

In addition, an embodiment herein provides a method of fabricating a gallium nitride semiconductor layer, the method comprising: masking an underlying gallium nitride layer with a mask that comprises an array of columns therein; and growing the underlying gallium nitride layer through the columns and onto the mask using metal-organic chemical vapor deposition pendeo-epitaxy to thereby form a pendeo-epitaxial gallium nitride layer coalesced on the mask to form a continuous pendeo-epitaxial monocrystalline gallium nitride semiconductor layer.

In addition, at least one semiconductor device may be formed in the pendeo-epitaxial gallium nitride semiconductor layer. The growing process may comprise metal-organic chemical vapor deposition pendeo-epitaxy of at least triethylgallium at 13-39 µmol/min. Furthermore, the pendeo-epitaxial gallium nitride semiconductor layer may be grown in growth temperatures between approximately 1,000° C. and 1,120° C. Moreover, the pendeo-epitaxial gallium nitride semiconductor layer may be grown with a V:III ratio of 2600. Additionally, the pendeo-epitaxial gallium nitride semiconductor layer may be grown with a chamber pressure of approximately 100 Torr.

Furthermore, an embodiment herein provides a semiconductor device comprising a substrate; a plurality of gallium nitride columns coupled to the substrate; a plurality of gallium nitride trenches, coupled to the substrate, wherein each of the plurality of gallium nitride columns are positioned alternate with each of the plurality of gallium nitride trenches; a low-defect density gallium nitride layer formed over the gallium nitride columns; and an active region including, but not limited to, a source, a drain, and a gate, wherein the active region is vertically aligned over the low-defect density layer. The source and the drain may comprise an ohmic contact and the gate may comprise a Schottky contact. Additionally, each of the plurality of gallium nitride columns may comprise at least two sidewalls and a post, and each of the at least two sidewalls is preferably directly coupled to a gallium nitride trench and the post. The substrate may comprise at least one of sapphire and gallium nitride. Furthermore, the plurality of gallium nitride columns and the plurality of gallium nitride trenches may be etched from a gallium nitride layer using at least one of front and backside photolithography. Moreover, the low-defect density gallium nitride layer may be formed over the gallium nitride columns using pendeo epitaxy. Also, the low-defect density gallium nitride layer may comprise a first defect density region formed over each of the plurality of gallium nitride columns and a second defect density formed over each of the plurality of gallium nitride trenches, and the second defect density region is preferably higher than first defect density region.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION

Figure 1:
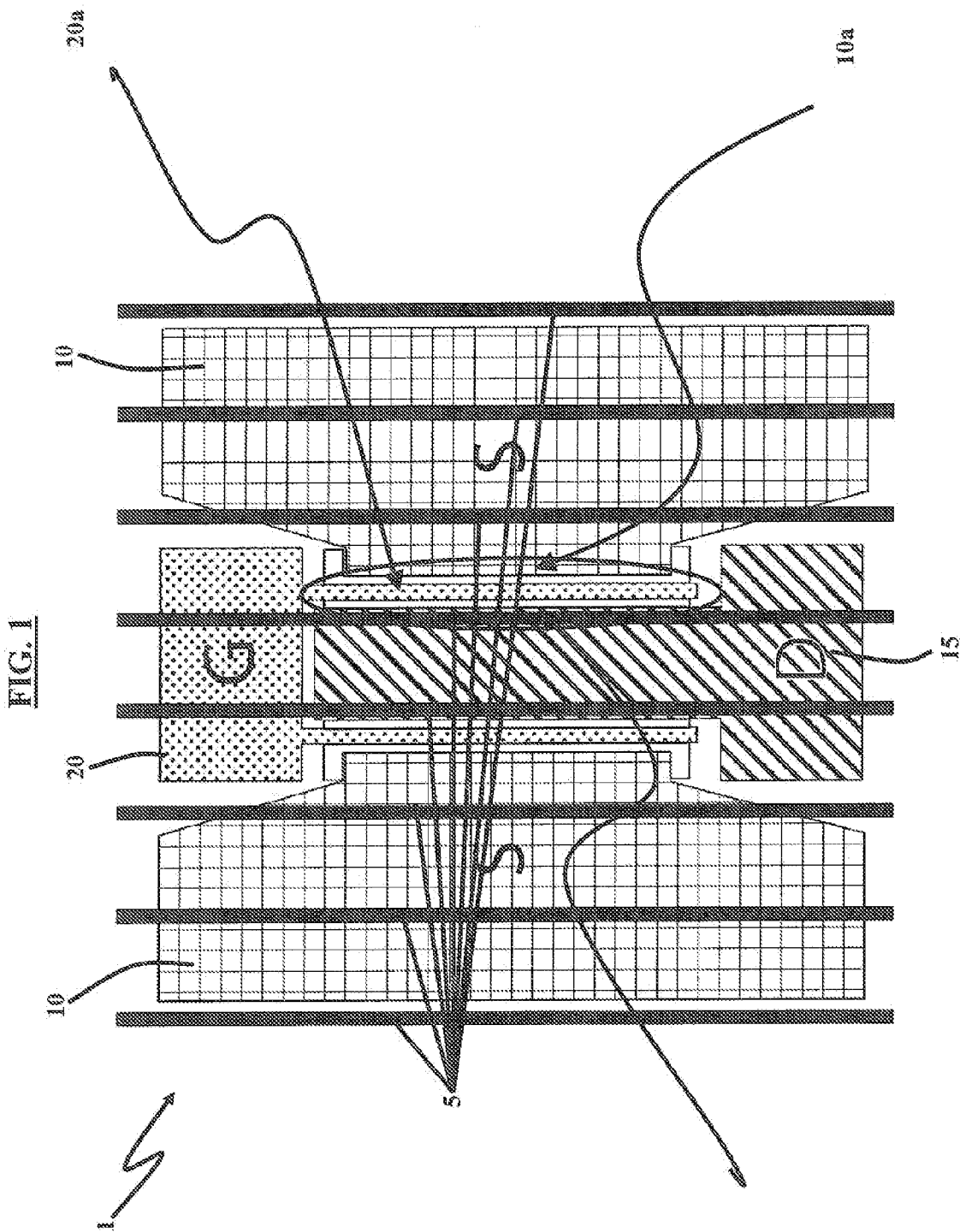
FIG. 1 illustrates a schematic diagram of a semiconductor device according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide optimized metal-organic chemical vapor deposition (or "MOCVD") growth parameters to produce a low-defect density pendeo-epitaxial gallium nitride material within a large area. Referring now to the drawings, and more particularly to FIGS. 1 through 6, where similar reference characters denote corresponding features consistently throughout the figures, there are shown preferred embodiments.

Gallium nitride (or "GaN") is a wide band-gap semiconductor having superior material characteristics for many electronics applications, compared to commonly used semiconductors such as silicon (or "Si") and gallium arsenide (or "GaAs"). GaN is a material that offers high-power, high frequency, high temperature applications and, performs much greater in these areas when compared to Si and much greater when compared to GaAs. Benefits of GaN-based devices are numerous and are beneficial to devices such as laser diodes, light emitting diodes, and p-n junctions, where each device shows significant improvement in operational characteristics such as lifetime, leakage current, and internal quantum efficiency when the devices are fabricated on GaN with a low-defect density region grown via selective area epitaxy.

However, inadequate long-term device reliability is currently a critical issue that must be solved to enable the insertion of GaN devices and integrated circuits into systems. Problems with long-term device reliability are related to a number of failure mechanisms that arise from degradation of the material properties within the GaN layers, and at the interfaces between GaN and other materials. Examples of structural defects that reduce the long-term device reliability include dislocations, stacking faults, microcrystalline grains, and grain boundaries. One approach for reduction of the defect density in GaN material is via selective area epitaxy; a common name for both the lateral epitaxial overgrowth (LEO) and the pendeo-epitaxial (PE) growth techniques. Methods of forming lateral gallium nitride layers that extend from an underlying gallium nitride layer are described in U.S. Pat. No. 6,051,849, the complete disclosure of which is herein incorporated by reference in its entirety. The pendeo-epitaxial approach for growth of GaN utilizes the lateral epitaxial growth mechanism, enabling the GaN material to grow laterally from the sidewalls of etched GaN rectangular columns with two to four orders of magnitude lower dislocation density than conventional growth techniques. Further details about the LEO and the PE growth techniques are discussed in Zheleva, T. et al., "Pendeo-Epitaxy—A New Approach for Lateral Growth of Gallium Nitride Films," Journal of Electronic Materials, 28, L5-L8 (1999), the complete disclosure of which, in its entirety, is herein incorporated by reference.

FIG. 1 shows a semiconductor device 1; for example, a High Electron Mobility Transistor (or "HEMT") semiconductor device 1. Semiconductor device 1 includes an active region 20a which is vertically aligned over a low-defect density GaN region described below. The active region in FIG. 1 includes portions 10a of the source 10, portions of the drain 15a of the drain 15, and portions of the gate 20a, specifically the fingers of the gate 20. GaN columns 5 are used to grow the low-defect density layer, as described below. While not shown in FIG. 1, source 10 and drain 15 include Ohmic contacts and are optionally formed between the low-defect density GaN layer and Ti/Al. In addition, gate 20 includes a Schottky contact (not shown) and is optionally formed between the low-defect density GaN layer and Ni/Au.

Figure 2:
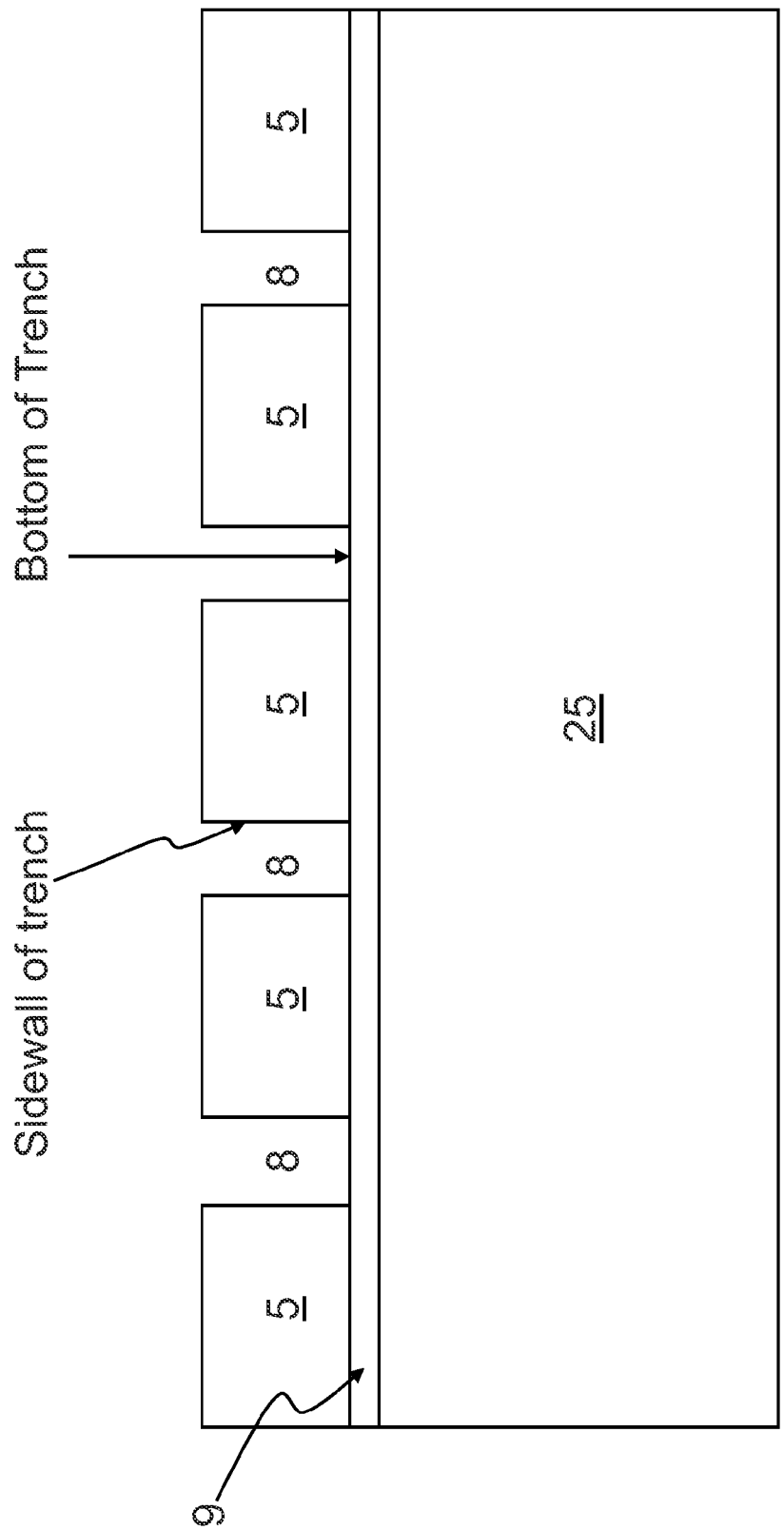
FIG. 2 illustrates a schematic diagram of a column and trench according to an embodiment herein.
Figure 3:
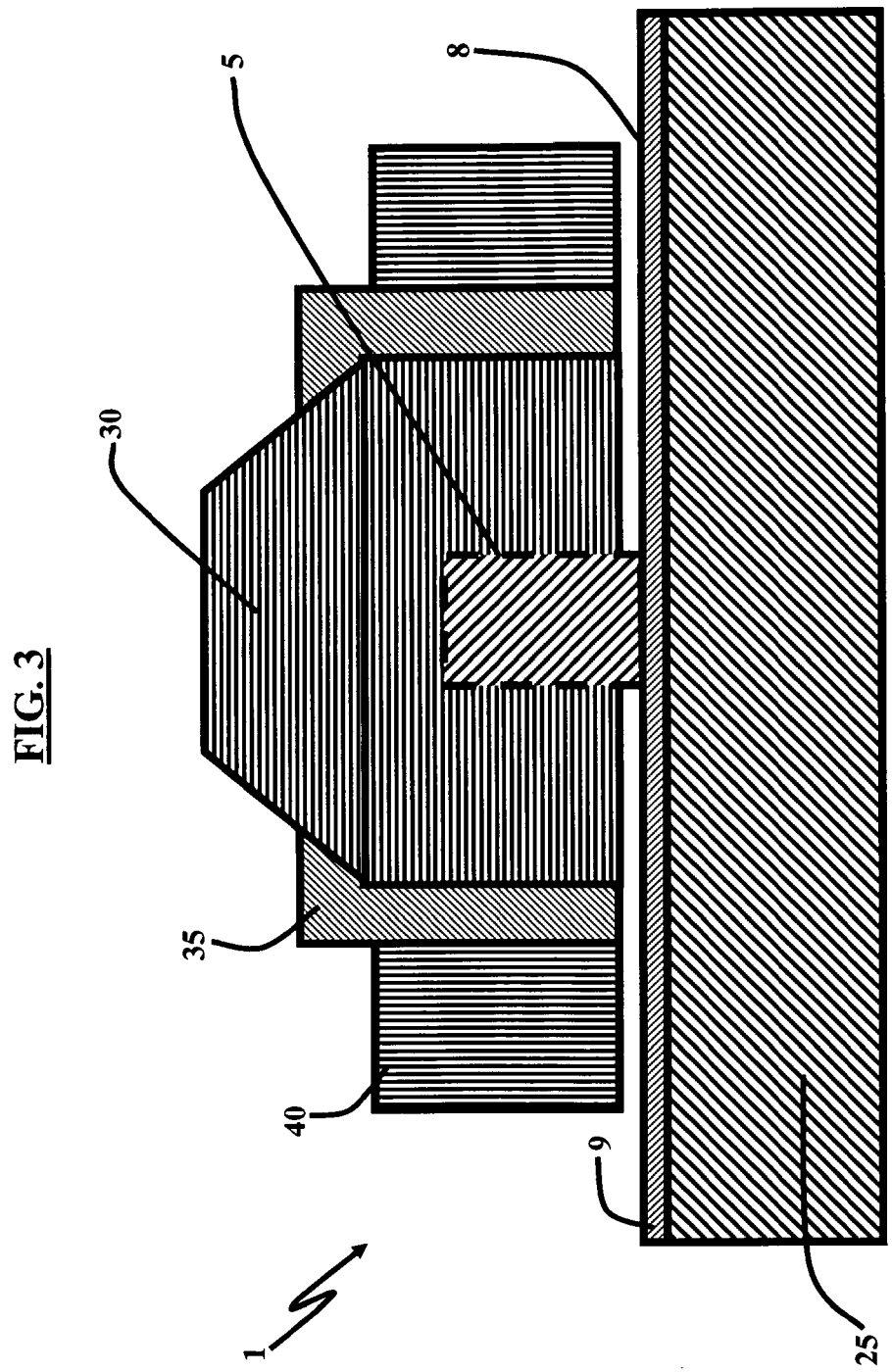
FIG. 3 illustrates a schematic diagram of a column and trench with lateral GaN growth according to an embodiment herein.

FIGS. 2 and 3, with reference to FIG. 1, illustrate in further detail the pendeo-epitaxy growth of low-defect density GaN layer 9 around the GaN columns 5. An underlying GaN layer is grown on a substrate 25. Substrate 25 may include sapphire or gallium nitride or Si or GaAs or other types of substrates. Substrate 25 may also include 61H—SiC and optionally an aluminum nitride buffer layer (not shown). The crystallographic designation conventions used herein are well-known to those having skill in the art, and need not be described further. In addition, the fabrication of substrate 25 is well-known to those having skill in the art and need not be described further. Fabrication of silicon carbide substrates are described, for example, in U.S. Pat. Nos. 4,865,685 to Palmour, Re 34,861 to Davis et al.; 4,912,064 to Kong et al., and 4,946,547 to Palmour et al., the complete disclosure of which, are herein incorporated by reference in their entireties.

For example, the underlying GaN layer 9 may be between approximately 1.0 and 2.0 μm thick, but not limited to this thickness. In addition, the underlying GaN layer 9 may be grown at approximately 1,000° C. on a high temperature (1,100° C.) aluminum nitride buffer layer that is deposited on a 6H—SiC substrate in a cold wall vertical and inductively heated metalorganic vapor phase epitaxy system using triethylgallium at approximately 26 mol/min, ammonia at approximately 1,500 sccm and approximately 3,000 sccm hydrogen diluent. Additional details of this growth technique may be found in Weeks, T. et al., "GaN Thin Films Deposited Via Organometallic Vapor Phase Epitaxy on α(6H)—SiC(0001) Using High-Temperature Monocrystalline AlN Buffer Layers," Applied Physics Letters, Vol. 67, No. 3, Jul. 17, 1995, pp. 401-403, the complete disclosure of which, in its entirety, is herein incorporated by reference. In addition, other substrates, with or without buffer layers may be used in accordance with the embodiments herein.

Still referring to FIG. 2, the underlying GaN layer 9 includes a plurality of GaN columns 5 etched therein. Each column 5 includes sidewalls 7 and post 6. It will be understood by those having skill in the art that sidewalls 7 may be thought of as being defined by a plurality of spaced apart columns 5. Sidewalls 7 may also be thought of as being defined by a plurality of trenches 8, also referred to as "wells" in the underlying GaN layer 9. Methods of forming gallium nitride layers into trenches are described in U.S. Pat. No. 6,265,289 the complete disclosure of which is herein incorporated by reference in its entirety. Sidewalls 7 may also be thought of as being defined by a series of alternating trenches 8 and columns 5. It will be understood that posts 6 and trenches 8 that define sidewalls 7 may be fabricated by selective etching and/or selective epitaxial growth and/or other suitable techniques. For example, columns 5 may be etched using front and backside photolithography. Moreover, it will also be understood that sidewalls 7 need not be orthogonal to substrate 25, but rather may be oblique thereto. Finally, it will also be understood that although sidewalls 7 are shown in cross-section in FIG. 2, posts 6 and trenches 8 may define elongated regions that are straight, V-shaped or have other shapes. While not shown in FIGS. 2 and 3, trenches 8 may extend into an optional buffer layer and into substrate 25, so that subsequent GaN growth occurs preferentially on sidewalls 7 rather than on the trench floors. In other embodiments, trenches 8 may not extend into substrate 25, and also may not extend into an optional buffer layer, depending, for example, on the geometry of trenches 8 and the lateral versus vertical growth rates of the GaN (as discussed below).

Referring now to FIG. 3, sidewalls 7 of the underlying GaN layer 9 are laterally grown to form a lateral GaN layer 9 formed in trenches 8. Lateral growth of GaN may be obtained at approximately 1,000 to 1,120° C. and 45 Torr. The precursors trimethyl gallium (TMG) at 13-39 µmol/min and $NH_3$ at 1,500 sccm may be used in combination with a 3,000 sccm $H_2$ diluent. If GaN alloys are formed, additional precursors of aluminum or indium, for example, may also be used. As used herein, the term "lateral" refers to a direction that is orthogonal to sidewalls 7. It will also be understood that some vertical growth on posts 6 may also take place during the lateral growth from sidewalls 7. As used herein, the term "vertical" denotes a directional parallel to sidewalls 7. At different temperatures, however, the shape of a grown lateral GaN layer 30 changes. As shown in FIG. 3, lateral GaN layer 30 is formed at approximately 1,060° C. Lateral GaN layer 35 is formed at approximately 1,080° C. Finally, lateral GaN layer 40 is formed at approximately 1,100° C. While not shown in FIG. 3, optimal lateral growth of a low-defect density GaN layer 40 occurs at approximately 1,120° C.

In addition, the continued growth of the lateral GaN layer 40 causes vertical growth onto the underlying GaN layer 9, specifically onto columns 5. Growth conditions for vertical growth may be maintained and characterized as was described in connection with lateral growth.

While not shown in FIG. 3, low-defect density pendeo growth is allowed to continue until the lateral growth fronts coalesce in trench 8 with an adjacent column (not shown) to form a continuous low-defect density layer in the trenches 8. In one example embodiment, the total growth time of a continuous low-defect density pendeo GaN layer takes approximated 60 minutes. As shown in FIG. 1, semiconductor device 1 (which includes source 10, drain 15, and gate 20) may then be vertically aligned over the low-density GaN layer. In addition, semiconductor structures may also be formed in a vertical GaN layer.

As discussed above, a lateral GaN layer 40 coalesces to form a continuous lateral GaN semiconductor layer in the trenches (e.g., trench 8). The dislocation densities in the underlying GaN layer 9 generally do not propagate laterally from sidewalls 7 with the same density as vertically from the underlying GaN layer 9 used to form column 5. Accordingly, low-defect density lateral GaN layer 40 may form device quality GaN semiconductor material. Thus, semiconductor device 1 may be formed in the lateral gallium nitride semiconductor layer 40 via a mask (not shown).

In addition, to characterize the electrical properties of the low dislocation density pendeo-grown GaN material and the conventional (non-pendeo) GaN material, Ohmic and Schottky contacts (not shown) may be fabricated on semiconductor 1, using standard lift-off photolithography on two types of material. The Ti (140 Å)/Al (2,200 Å) Ohmic contacts are annealed at approximately 800° C. for 60 seconds prior to the Schottky contact metallization. The Ni (500 Å)/Au (1,500 Å) Schottky contacts are prepared via e-beam deposition. Current-voltage (I-V) characteristics are measured between −10 V and 5 V after preparation.

Figure 4:
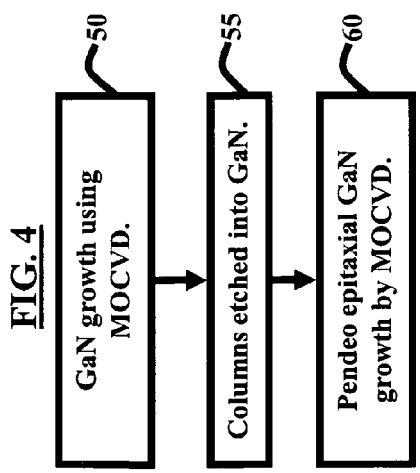
FIG. 4 is a flow diagram illustrating a method according to an embodiment herein.

FIG. 4, with reference to FIGS. 1 through 3, describes an exemplary method for growing a low-defect density GaN layer. At step 50, a first GaN layer 9 is grown using conventional metal-organic chemical vapor deposition (or "MOCVD") techniques. Desirably, the first GaN layer 9 is grown to approximately 1.5 µm depth. The crystallographic designation conventions used herein, and specifically conventional MOCVD growth techniques, are well-known to those having skill in the art, and need not be described further. Next, at step 55, a plurality of pendeo-growth columns 5 and trenches 8 are etched into the first GaN layer 9. Optionally, the pendeo-growth columns 5 are etched into the first GaN layer 9 using front and/or backside photolithography. Finally, at step 60, pendeo-epitaxial GaN is grown using MOCVD.

During step 60, optimal pendeo-epitaxial GaN growth is obtained when using the following MOCVD growth parameters: growth temperature between 1,060° C.-1,120° C., ammonia to triethylgallium (V/III ratio 1,200 to 3,600), chamber pressure to grow the GaN is between $1.07 \times 10^4$ Pascal (or 80 Torr) to $1.6 \times 10^4$ Pascal (or 120 Torr)), and mask geometry, to etch the pendeo-growth columns, that include a column width between approximately 2 µm or 3 µm and a trench width, as situated between a pair of columns 5, is either approximately 12 µm, 14 µm, or 20 µm. These growth parameters are used to optimize the lateral to vertical growth rate at a given pattern geometry (e.g., the gate 20 shown in FIG. 1). In addition, a broad range of material characterization techniques are employed to establish the optimized growth and device processing parameters.

The structural quality of the GaN material is commonly characterized by scanning electron microscopy (SEM), atomic force microscopy (AFM), transmission electron microscopy (TEM), spectroscopic cathodoluminescence (CL), and etch pit density (EPD) measurements. In addition, in determining the distribution of dislocations throughout the material grown is determined by etching with molten potassium hydroxide (KOH) at approximately 450° C. for approximately 5 minutes, to expose the areas with threading dislocations that have a higher etch rate than dislocation-free areas.

An optimal low-defect density GaN layer, with the highest lateral-to-vertical growth rate ratio, is achieved at growth temperatures of approximately 1,100° C. to 1,120° C., V:III ratio of 2600 and chamber pressure of approximately 100 Torr. Under these conditions, the pendeo-epitaxial "wing" (or lateral growth area for each pendeo-growth column) areas of dimensions 7 µm×100 µm, corresponding to lateral growth, are nearly free of dislocation-related etch-pits. AFM imaging of the etched GaN stripe grown via pendeo-epitaxy, with dislocations revealed as etch-pits having densities of $8.95 \pm 0.6 \times 10^8$ and $2.8 \pm 3 \times 10^6$ $cm^{-2}$ for the non-pendeo (vertical growth) and the pendeo (lateral growth) regions, respectively. Areas of pendeo-epitaxial GaN investigated by AFM as large as 5 microns by 10 microns are consistently observed to be free of dislocations. The root-mean-squared (RMS) surface roughness of the non-pendeo and the pendeo GaN regions is $1.38 \pm 0.9$ nm and $0.3 \pm 0.08$ nm, respectively. Thus, the dislocation density goes through drastic reduction of 320 times, while the surface roughness is reduced nearly five times.

Figure 5:
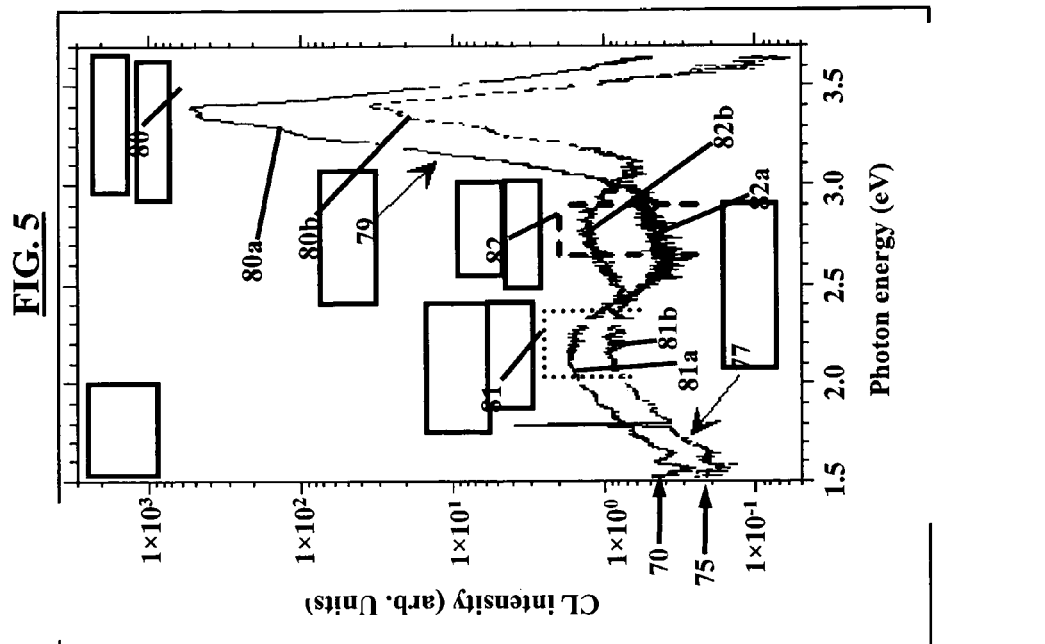
FIG. 5 illustrates cathodoluminescence (CL) imaging and spectroscopy spectra in the 1.5 eV to the 3.7 eV range for pendeo and non-pendeo growth columns.

Further characterization of the structural and optical properties of the pendeo and non-pendeo GaN material according to the embodiments described herein are performed via cathodoluminescence (CL) imaging and spectroscopy. The CL intensity is seen to be distinctly higher from the low defect density pendeo GaN regions than from the non-pendeo material in the center of each GaN column 5 (shown in FIG. 1). The CL intensity is also very low from trenches 8 between the GaN columns 5, as shown in FIGS. 2 and 3. This difference is attributed to the presence of a higher density of non-radiative recombination centers in the non-pendeo material, associated with impurities and point defects clustered around the dislocation cores. Local areas of lower CL intensity (dark contrast), with a highly non-uniform spatial distribution, are also observed near the outer edges of the pendeo-grown regions adjacent to trenches 8 between columns 5. These localized "dark contrast" areas arise from the extended defects, mostly threading dislocations, that propagate initially vertically from the center of columns 5 and then laterally to the outer edges of columns 5. In FIG. 5, with reference to FIGS. 1 though 4, CL spectra in the 1.5 eV to 3.7 eV range are shown for pendeo growth 70 and non-pendeo growth 75, and are acquired from the center region 77 (e.g., vertical growth about the pendeo-growth columns 5) and the wing region 79 (e.g., lateral growth from the pendeo-growth columns 5). There is over one order of magnitude increase in the PL intensity of the near band edge or excitonic peak 80 (in the 3.2 eV to 3.5 eV range), from the pendeo-GaN region (shown as 80a), as compared to the non-pendeo region (shown as 80b). Interestingly, band 81 (2.0 eV to 2.3 eV) is stronger for the pendeo-GaN region (shown as 81a), by about a factor of two, than the non-pendeo region (shown as 81b). On the other hand, band 82 (2.65 eV to 2.9 eV) is relatively strong for the non-pendeo region (shown as 82b), while the pendeo-GaN region (shown as 82a) does not show a distinct peak in band 82. Band 81 and band 82 in GaN are attributed to impurities or (impurity-point defect) complexes. In particular band 81 is ascribed to deep donor-acceptor recombination involving C and O impurities, or to (gallium vacancy)—(C or O impurity) complexes acting as deep acceptors. Band 82 is ascribed to deep donor-acceptor recombination involving C impurities, or to Zn deep acceptors. Since the intensity of band 81 is reduced by a factor of two in the high dislocation density non-pendeo regions 81b (as compared to the pendeo-grown region 81a), it suggests that band 81 is quenched by the same non-radiative recombination centers, associated with dislocations, that give rise to quenching of the exciton band in the non-pendeo regions. In addition, since a distinct band 82 occurs only in the non-pendeo region 82b, it suggests that the luminescence centers corresponding to ban 82 (impurities and point defects) occur near the dislocation cores.

Figure 6:
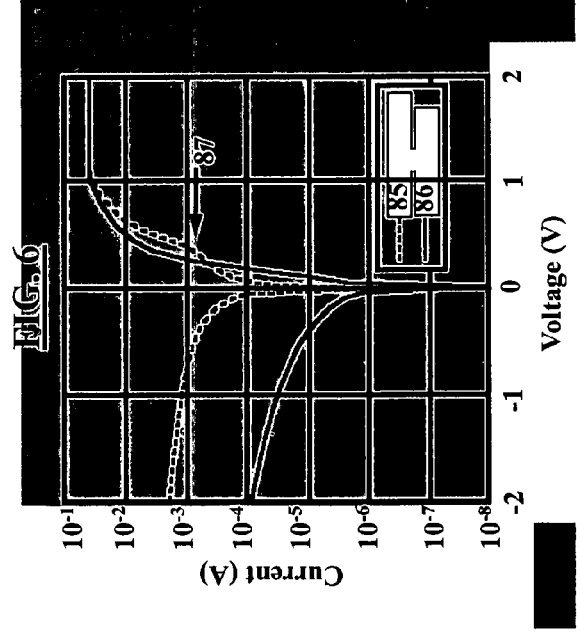

As mentioned previously, the low-defect density GaN layer 9 is used to fabricate Schottky Ni (500 Å)/Au (1500 Å) contacts such that the Schottky diodes are aligned with the low defect density pendeo-GaN regions. FIG. 6 illustrates the current-voltage characteristics of Schottky diodes fabricated on both pendeo region (shown as 85) and non-pendeo GaN region (shown as 86) are measured between −10 V and 5 V. The ideality factor, n, describes how closely the Schottky diode follows thermionic emission theory. A perfectly ideal diode has n=1.0. In practicality, ideality factors are greater than unity. Schottky contacts with low ideality factors indicate an improved metal-semiconductor interface, while higher ideality factors indicate current transport mechanisms other than thermionic emission. All diodes fabricated on the pendeo epitaxial material, as discussed in the embodiments described herein, display near-ideal characteristics under forward bias with an average ideality factor of n=1.32±0.04. Conversely, Schottky diodes on non-pendeo material display non-ideal characteristics with an average ideality factor of 1.73±0.35. While the Schottky diodes on the pendeo-GaN material display close to ideal linear behavior, the Schottky diodes on the non-pendeo columns 5 all display a characteristic "knee" (shown as 87) at low forward voltage that is typical of two barrier heights acting in parallel. These phenomena occur when "patches" of inhomogeneous Schottky barrier height materials are present at the metal-semiconductor interface. In addition, at a −2V reverse bias the average leakage current is measured to be $6.7\pm2.8\times10^{-5}$ A and $2.1\pm6.8\times10^{-4}$ A for the pendeo and non-pendeo material, respectively. For both cases of the leakage current, the large standard deviation can be explained by the large differences in the leakage current, likely due to the proximity to an extended defect such as a threading dislocation core. These variations can be over an order of magnitude from the lowest value to the highest value. The larger standard deviations for the non-pendeo material are likely due to the large variation in ideality factors and leakage currents. Overall, the diodes on the pendeo-epitaxial material show more uniformity in terms of ideality and leakage current, due to the lower defect density material. The reduction of the leakage current is another indication of the improved electrical properties of the pendeo-epitaxial material.

The optimization of the MOCVD growth parameters described herein produce low-defect density pendeo-epitaxial GaN material within a large area (7 μm×100 μm). Devices fabricated on the pendeo-epitaxial GaN, such as Schottky diodes, show nearly two orders of magnitude reduction in leakage current and approximately 25% improvement in ideality factor, as compared to diodes of similar structure fabricated on non-pendeo material.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A gallium nitride semiconductor device comprising:
   a first gallium nitride layer comprising a plurality of gallium nitride columns and trenches etched into said first gallium nitride layer and a first dislocation density;
   a second gallium nitride layer that comprises of two regions, a first region that is adjacent to the side walls of the gallium nitride columns further comprising a second layer of regions with a low and a high dislocation density having a low dislocation density and a second region that extends over said gallium nitride columns and comprises a higher dislocation density than the dislocation density of the first region;
   wherein on top of the second gallium nitride layer that comprises a low defect density region over trenches there is a Schottky contact, said Schottky contact comprised of about 500 Å of nickel and about 1,500 Å of gold;
  the device further comprising vertically aligned active regions of a semiconductor lateral device with the low defect density regions of the second gallium nitride layer, wherein said semiconductor lateral device extends beyond a top of two or more columns (5) and has multiple active regions wherein each active region is aligned so that a current flows only in the low defect density regions;
  wherein said semiconductor device active regions are between an edge of a Source (S) and an edge of a Drain (D), and further wherein the Source (S) edge and Drain (D) are positioned so that the current flows only in low defect density regions;
  wherein the current flows only in areas of low defect density and Source (S), Gate (G), and Drain (D) are on one plane, on a top of the device; and
  further wherein said gate (20) finger (20*a*) is within and on a top of the low defect density region.

2. The device of claim 1, wherein said first gallium nitride layer of the device is vertically aligned over said second gallium nitride layer.

3. The device of claim 1, wherein each of said plurality of gallium nitride columns are from about 1 μm to about 200 μm wide.

4. The device of claim 1, wherein each of said plurality of gallium nitride columns are separated by a distance of at least one of 1 μm.

5. A semiconductor device comprising:
  a substrate;
  a plurality of gallium nitride columns coupled to said substrate;
  a plurality of gallium nitride trenches, coupled to said substrate, wherein each of said plurality of gallium nitride columns are positioned alternate with each of said plurality of gallium nitride trenches;
  a low defect density region in the second gallium nitride layer formed over said gallium nitride trenches; and
  an active region of a transistor
  the device further comprising vertical aligned active regions of a semiconductor lateral device with the low defect density regions of the second gallium nitride layer, wherein said semiconductor lateral device extends beyond a top of two or more columns (5) and has multiple active regions wherein each active region is aligned so that a current flows only in the low defect density regions;
  wherein said semiconductor device active regions are between an edge of a Source (S) and an edge of a Drain (D), and further wherein the Source (S) edge and Drain (D) are positioned so that the current flows only in low defect density regions;
  wherein the current flows only in areas of low defect density and Source (S), Gate (G), and Drain (D) are on one plane, on a top of the device; and
  further herein said gate (20) finger (20*a*) is within and on a top of the low defect density region.

6. The semiconductor device of claim 5, wherein a Source (S) and a Detrain (D) comprise an ohmic contact and a Gate (G) comprises a Schottky contact.

7. The semiconductor device of claim 5, wherein said substrate comprises at least one of sapphire and gallium nitride.

8. The semiconductor device of claim 5, wherein said plurality of gallium nitride columns and said plurality of gallium nitride trenches are etched from a gallium nitride layer comprising both front and backside alignment marks for photolithography.

9. The semiconductor device of claim 5, wherein said low defect density gallium nitride layer is formed over said gallium nitride columns using pendeo epitaxy.

10. The semiconductor device of claim 9, wherein said low defect density gallium nitride layer comprises a first defect density region formed over each of said plurality of gallium nitride columns and a second defect density region formed over each of said plurality of gallium nitride trenches, and wherein said first defect density region is higher than said second defect density region.

* * * * *

UNITED STATES PATENT AND TRADEMARK OFFICE
Certificate

Patent No. 8,637,901 B2

Patented: January 28, 2014

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Tsvetanka Zheleva, Rockville, MD (US); Shah Pankaj, Rockville, MD (US); Michael Derenge, Columbia, MD (US); and Daniel J. Ewing, Kensington, MD (US).

Signed and Sealed this Tenth Day of June 2014.

MATTHEW C. LANDAU
*Supervisory Patent Examiner*
Art Unit 2891
Technology Center 2800